United States Patent [19]

Fassino

[11] Patent Number: 4,485,356
[45] Date of Patent: Nov. 27, 1984

[54] VARIABLE LOW FREQUENCY SINUSOIDAL OSCILLATOR USING SIMULATED INDUCTANCE

[76] Inventor: Lorenzo Fassino, Via Borgosesia 46 bis, Turin, Italy

[21] Appl. No.: 385,067

[22] Filed: Jun. 4, 1982

[51] Int. Cl.³ .............................................. H03B 5/26
[52] U.S. Cl. .................................... 331/132; 331/140; 331/167; 333/215
[58] Field of Search ................... 331/108 D, 132, 140, 331/167; 333/214, 215

[56] References Cited

U.S. PATENT DOCUMENTS 3,573,647  4/1971  Antoniou ........................ 333/215 X
4,091,340  5/1978  Greaves et al. ................. 333/214 X Primary Examiner—Siegfried H. Grimm
Attorney, Agent, or Firm—McGlew and Tuttle

[57] ABSTRACT

A low frequency sinusoidal oscillator, comprises a circuit which contains operational amplifiers, resistors and capacitors and has no inductor. The circuit, however, operates as an inductor. The circuit is arranged to resonate at a frequency which may be chosen by acting on only one component which preferably is a resistive component.

1 Claim, 2 Drawing Figures

VARIABLE LOW FREQUENCY SINUSOIDAL OSCILLATOR USING SIMULATED INDUCTANCE

FIELD AND BACKGROUND OF THE INVENTION

Different kinds of sinusoidal oscillators are known, for instance negative resistance oscillators, feedback oscillators, phase-shift oscillators, resonance oscillators.

The present invention concerns a resonance sinusoidal oscillator, suitable for low frequency applications, in which the resonant circuit comprises a conventional capacitive element whereas the inductive element is formed by an active electric two-terminal network which has no coil or magnetic core and comprises only operational amplifiers, resistors and capacitors.

As a low frequency oscillator is of interest, such a two-terminal network cannot be a resonant cavity or a helicoidal resonator or any other kind of distributed-parameter electromagnetic resonator. Also piezoelectric and magnetostrictive resonators cannot be employed, so that the known technique makes use of LC oscillators in which the oscillation frequency is given by the relation:

$$f_o = \frac{1}{2\pi \sqrt{LC}} \quad (1)$$

If a frequency variable within a wide range of relatively low values (for instance a frequency below 20 kHz) is to be obtained, it is not a practical solution to vary the value of L and C while keeping within acceptable limits the component size; also, it is not suitable to use in the circuit varactor diodes whose capacitance, variable depending on the control voltage, is of few picofarads.

SUMMARY OF THE INVENTION

The object of the invention is to provide a variable low-frequency sinusoidal oscillator, whose frequency can be varied in a continuous manner by acting upon only one parameter.

According to the invention, the oscillator comprises an active two-terminal network formed by operational amplifiers and discrete resistors and capacitors.

The oscillator preferably comprises a two-terminal network consisting in a chain formed by the series of a first resistor, a first capacitor, three further resistors and by two operational amplifiers, the inverting inputs of which are connected to each other and to the common terminal of the second and third resistors, whereas the non-inverting input of the first amplifier is connected to the end of said fourth resistor and the non inverting input of the second amplifier is connected to the common terminal of the first resistor and of the capacitor, the output of the first amplifier being connected to the common terminal of the capacitor and of the second resistor and the output of the second amplifier being connected to the common terminal of the third and fourth resistors. The circuit also comprises a second capacitor and a fifth resistor, connected in parallel to the ends of said chain of five elements.

BRIEF DESCRIPTION OF THE DRAWING

The invention will be better explained with reference to the annexed drawing, in which.

DESCRIPTION OF THE PREFERRED EMBODIMENT

Figure 1:
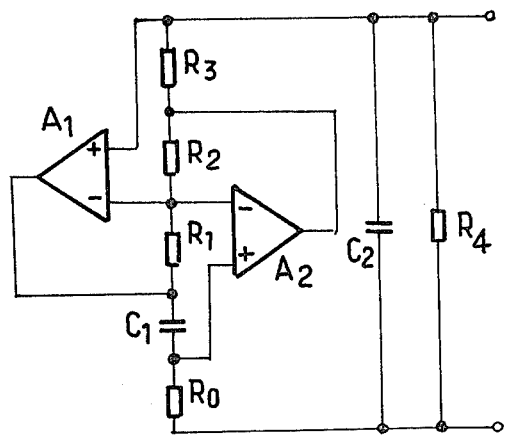
FIG. 1 is the diagram of the resonator according to the invention.

FIG. 1 shows the operational amplifiers $A_1$ and $A_2$ connected in the manner depicted to resistor $R_o$, capacitor $C_1$, resistors $R_1$, $R_2$, $R_3$, the parallel group of capacitor $C_2$ and resistor $R_4$.

Assuming by sake of simplicity that $A_1$ and $A_2$ are ideal amplifiers, with infinite gain, the impedance of the bipole shown in FIG. 1 is:

$$Z = \frac{1}{sC_2 + \frac{1}{R_4} + \frac{R_2}{sR_oR_3R_1C_1}} \quad (2)$$

where s is the complex variable $\sigma + j\omega$, $\sigma$ being the attenuation and $\omega$ the angular frequency.

From relation (2) the oscillation frequency can be obtained, said frequency being:

$$f_o = \frac{1}{2\pi} \sqrt{\frac{R_2}{R_oR_1R_3C_1C_2}} \quad (3)$$

The similarity with relation (1) is clearly apparent, the difference being that in relation (1) the frequency depends only on two parameters L, C, whereas in this case it depends on six parameters, i.e. four resistances and two capacitances.

In the case of low frequencies (for instance from 300 to 20,000Hz) which is of interest for the present invention, it is suitable to vary any one of the resistances, and preferably that of resistor $R_o$ which, being at one end of the chain, is more easily accessible.

As an alternative, also one capacitance may be varied stepwise, so as to divide the variation range of the frequency generated into partial ranges.

The resistance variation may be achieved by using a potentiometer or an active, voltage controlled device, such as a field effect transistor; in this way the electronic tuning is particularly easy to obtain.

Once a circuit equivalent to a resonant two-terminal network has been realized according to the diagram of FIG. 1, said circuit can be introduced into an oscillator.

Figure 2:
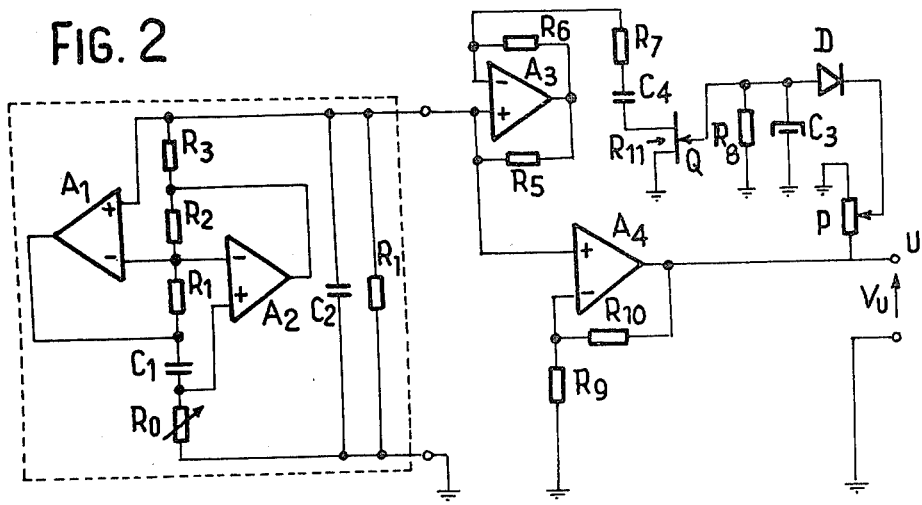
FIG. 2 is the diagram of an oscillator employing said resonator.

FIG. 2 shows an exemplary diagram of the oscillator. The block in broken lines shows the described two-terminal network, one terminal of which is connected to the common terminal (ground) and the other is connected to the non-inverting terminals of two operational amplifiers $A_3$ and $A_4$. The non-inverting terminal of $A_3$ is also connected, through resistor $R_5$, to the output of the same amplifier, which output is also connected to the inverting input through resistor $R_6$. This input is also connected to a resistor $R_7$ which is connected in series to a capacitor $C_4$ the other terminal of which is connected to the source of a field effect transistor Q, the drain of which is grounded.

The inverting input of amplifier $A_4$ is grounded through resistor $R_9$ and is also connected to the amplifier output through a resistor $R_{10}$.

The output of $A_4$ is also connected to utilization terminal U and to potentiometer P, the other terminal of which is grounded while the sliding contact is connected to the cathode of a diode $D_1$. The anode of $D_1$ is connected to both the gate of field effect transistor Q and ground, through resistor $R_8$ and capacitor $C_3$ in parallel.

The operation of the circuit is as follows: amplifier $A_3$ has a positive feedback through resistor $R_5$ and the resonant two-terminal network of FIG. 1; therefore, it generates an oscillation at frequency $f_o$.

Amplifier $A_4$, with negative feedback provided by $R_9$ and $R_{10}$, receives the oscillation at its non inverting input and supplies the amplified signal to the oscillator output and to potentiometer P. The signal is taken from the sliding contact of P, is rectified and averaged by diode D and components $C_3$ and $R_8$ and is then fed to the control terminal of field effect transistor Q. Across the output terminals (drain and source) of Q a resistance (shown in FIG. 2 as $R_{11}$), is available whose value depends upon the control voltage and hence from the amplitude of the output signal. The variable resistance of transistor Q, in series with $R_7$ (neglecting the effect of blocking capacitor $C_4$) generates together with $R_6$ a negative feedback for amplifier $A_3$, which feedback varies in dependance of the amplitude of the output signal. The variable negative feedback is necessary to ensure an automatic control of the amplitude of the output signal in order that, when the operating conditions of the oscillator change, amplifier $A_3$ always operates in almost linear conditions and the oscillation generated has, therefore, a shape as close as possible to the sinusoidal shape.

Experiments carried out have shown that the described circuit has the following advantages: the frequency may be varied by acting on only one parameter; the circuit has no coils in air or wound on magnetic cores; the circuit is very resistant to aging and is of cheap manufacture and maintenance.

The examples described are not limitative and the invention comprises similar circuits employing amplifiers, resistors and capacitors to realize a resonant two-terminal network without inductors.

What I claim is:

1. A variable low frequency sinusoidal oscillator, including a resonant circuit with variable Q factor consisting of: a first capacitor; a simulated inductance connected in parallel with said first capacitor and comprising the series of a first resistor, of a second capacitor and of second, third and fourth resistors, in which series the first resistor has one terminal connected to earth and can be used as the only element connected to earth to vary the oscillation frequency, the simulated inductance further comprising a first and a second operational amplifier each having an inverting input terminal, a noninverting input terminal and an output terminal, the inverting input terminal of said first and second amplifiers being connected to each other and to a common terminal of said second and third resistors, the noninverting input terminal of the first amplifier being connected to one terminal of the fourth resistor and the noninverting input terminal of said second amplifier being connected to a common terminal of said first resistor and said second capacitor, the output of the first amplifier being connected to a common terminal of the second capacitor and the second resistor and the output of the second amplifier being connected to a common terminal of said third and fourth resistors; a fifth resistor connected in parallel with said first capacitor and having a resistance which can be varied to vary the Q factor of the resonant circuit; wherein, to provide oscillation, a third operational amplifier also having an inverting input terminal, a noninverting input terminal and an output terminal is provided, the noninverting input terminal of said third amplifier being connected to a common terminal of said fourth and fifth resistors and said first capacitor, a sixth resistor being connected between the output terminal and the noninverting input terminal of said third amplifier to provide positive feedback, said third amplifier being also associated with a negative feedback loop comprising a fourth operational amplifier with inverting and noninverting input terminals and an output terminal in which the noninverting input terminal is connected to the noninverting input terminal of said third amplifier, the inverting input terminal is connected to earth through a seventh resistor and to the output terminal through an eighth resistor, the output terminal of said fourth amplifier being the fixed level oscillator output terminal, the negative feedback loop further comprising: a potentiometer connected between said output terminal of the fourth amplifier and earth, which potentiometer is used to adjust for minimum distortion and has a sliding contact through which a feedback signal is derived; a diode with a cathode and an anode, the cathode being connected to said sliding contact and the anode being connected to one terminal of a ninth resistor and of a third capacitor, both having a second terminal connected to earth; a field effect transistor with gate, source and drain terminals, of which the gate terminal is connected to the anode of said diode, the drain terminal is connected to earth and the source terminal is connected to the inverting input of said third amplifier through a fourth capacitor and a tenth resistor in series, an eleventh resistor being connected between the inverting input terminal and the output terminal of said third amplifier.

* * * * *